United States Patent [19]

Whitney

[11] Patent Number: 5,445,974
[45] Date of Patent: Aug. 29, 1995

[54] METHOD OF FABRICATING A HIGH-VOLTAGE, VERTICAL-TRENCH SEMICONDUCTOR DEVICE

[75] Inventor: David Whitney, San Jose, Calif.

[73] Assignee: Siemens Components, Inc., Iselin, N.J.

[21] Appl. No.: 120,147

[22] Filed: Sep. 10, 1993

Related U.S. Application Data

[62] Division of Ser. No. 40,830, Mar. 31, 1993, abandoned.

[51] Int. Cl.$^6$ .................. H01L 49/00; H01L 21/461
[52] U.S. Cl. .................................. 437/6; 437/249; 437/915; 437/220
[58] Field of Search ............... 437/6, 14, 160, 249, 437/915, 220; 257/117, 162, 168, 170, 173, 177, 180; 148/DIG. 164

[56] References Cited

U.S. PATENT DOCUMENTS

| | | | |
|---|---|---|---|
| 3,211,971 | 10/1965 | Barson et al. | 317/235 |
| 3,370,209 | 2/1968 | Davis et al. | 317/235 |
| 3,864,726 | 2/1975 | Schäfer | 357/38 |
| 4,051,507 | 9/1977 | Rosvold | 437/208 |
| 4,118,257 | 10/1978 | Oberreuter et al. | 437/6 |
| 4,849,800 | 7/1989 | Abbas et al. | 357/38 |
| 5,344,794 | 9/1994 | Whitney et al. | 437/209 |

FOREIGN PATENT DOCUMENTS

| | | |
|---|---|---|
| 0082419 | 6/1983 | European Pat. Off. . |
| 0262485 | 4/1988 | European Pat. Off. . |
| 56-150863 | 11/1981 | Japan . |
| 61-058279 | 3/1986 | Japan . |

OTHER PUBLICATIONS

2 Silicon Processing for the VLSI Era Stanley Wolf 84 (1990).

*Primary Examiner*—Olik Chaudhuri
*Assistant Examiner*—Brian K. Dutton
*Attorney, Agent, or Firm*—Joseph S. Codispoti

[57] ABSTRACT

An optically-triggered silicon controlled rectifier (SCR) (21) having a number of semiconductor layers (23, 24, 31) diffused into an N type substrate (22). Specifically, the SCR is formed by diffusing a first P+ layer (23) into an upper surface of the substrate. Then, an N+ layer (24) is diffused into a portion of an upper surface of the first P+ layer. An oxide layer (25) which is permeable to optical radiation is formed on the first P+ layer. A conductive cathode terminal (26) is then deposited on the N+ layer. Therefore, a trench (30) is etched in the lower surface of the substrate. The trench is defined by a depth and a surface. A second P+ layer (31) is diffused into the surface of the trench. The depth of the trench substantially defines a spacing between the first and second P+ layers. The chip is soldered onto a pedestal (33) formed on a lead frame (34). The solder is deposited in the trench and contacts the second P+ layer to form an anode terminal (36). The pedestal may be formed by either etching or stamping a depression (35) in the lead frame.

10 Claims, 1 Drawing Sheet

METHOD OF FABRICATING A HIGH-VOLTAGE, VERTICAL-TRENCH SEMICONDUCTOR DEVICE

This is a divisional of application Ser. No. 08/040,830 filed Mar. 31, 1993, now abandoned.

BACKGROUND OF THE INVENTION

1. Field of the Invention

The invention relates to the field of solid state electronics. More particularly, the invention relates to a method of fabricating a semiconductor device and a device so formed.

2. Description of the Prior Art

In general, when fabricating a semiconductor device, a particular spacing between layers of semiconductor material produces a device having particular operating characteristics. For example, a correct anode-to-cathode spacing in a silicon controlled rectifier (SCR) is critical to achieving particular operating characteristics such as a certain level of forward voltage. Specifically, in a vertical SCR, an anode layer and a cathode layer are produced on opposing surfaces of a semiconductor wafer. Obtaining the correct anode-to-cathode spacing, i.e., a distance between the anode and cathode layers, in a vertical SCR is typically accomplished by choosing a thin silicon wafer and diffusing appropriate anode and cathode dopants deep into the wafer. The depth of the diffusion determines the anode-to-cathode spacing. Although deep diffusion techniques produce useful vertical SCRs, unfortunately considerable difficulty has been experienced by those skilled in the art in accurately diffusing the dopant to a required depth. Also, the depth to which adopant can be diffused into a substrate has practical limitations. Additionally, diffusion inaccuracy increases with required diffusion depth; therefore, the diffusion inaccuracy and the limited diffusion depth limits deep diffusion techniques to use with very thin wafers. Consequently, maximum wafer diameter, which is a function of wafer thickness, is severely limited.

Consequently, those concerned with the development of semiconductor devices, such as vertical SCRs, have long recognized the need for improved fabrication techniques which mitigate problems associated with achieving accurate layer spacing.

SUMMARY OF THE INVENTION

To remedy the deficiencies in the art, our present invention teaches the use of a unique trench construction etched into one surface of a semiconductor wafer. As a result of this construction, an etched depth of the trench defines the inner-layer spacing of semiconductor material that forms the semiconductor device.

In general, our invention is directed to a semiconductor device having a semiconductor substrate with first and second opposed surfaces. The first surface of the substrate contains a first layer of doped impurities. A trench, having a depth and a surface, is formed in the second surface of the substrate. The surface of the trench contains a second layer of doped impurities, such that a spacing between these two layers is primarily defined by the depth of the trench.

Additionally, the invention is directed to a method of fabricating a semiconductor device. Using our inventive method, a first layer of doped impurities is diffused into a first surface of a semiconductor substrate. A trench, having a depth and a surface, is etched into a second substrate surface. The first and second substrate surfaces are opposing planar sides of the substrate. A second layer of doped impurities is diffused into the surface of the trench such that a spacing between the first and second layers is primarily defined by the depth of the trench.

More specifically, using our inventive fabrication technique, an SCR semiconductor device is formed using a number of layers of semiconductor material diffused into an N type substrate. A first P+ layer is diffused into an upper surface of the substrate. An N+ layer is diffused into a portion of the upper surface of the first P+ layer. An oxide layer is formed on the first P+ layer. A conductive cathode contact is deposited on the N+ layer. A trench is etched in a lower surface of the substrate. The trench is formed having a depth and a surface defined by sides and a bottom. A second P+ layer is diffused into the surface of the trench such that the depth of the trench primarily defines a spacing between the first and second P+ layers. Solder is deposited in the trench and contacts the second P+ layer to form an anode terminal. Additionally, the solder connects the device to a lead frame. The lead frame provides structural support for the semiconductor device and a contact to which a device lead can be connected.

BRIEF DESCRIPTION OF THE DRAWING

The teachings of the present invention can be readily understood by considering the following detailed description in conjunction with the accompanying drawing, in which.

DETAILED DESCRIPTION OF THE PREFERRED EMBODIMENT

Figure 1:
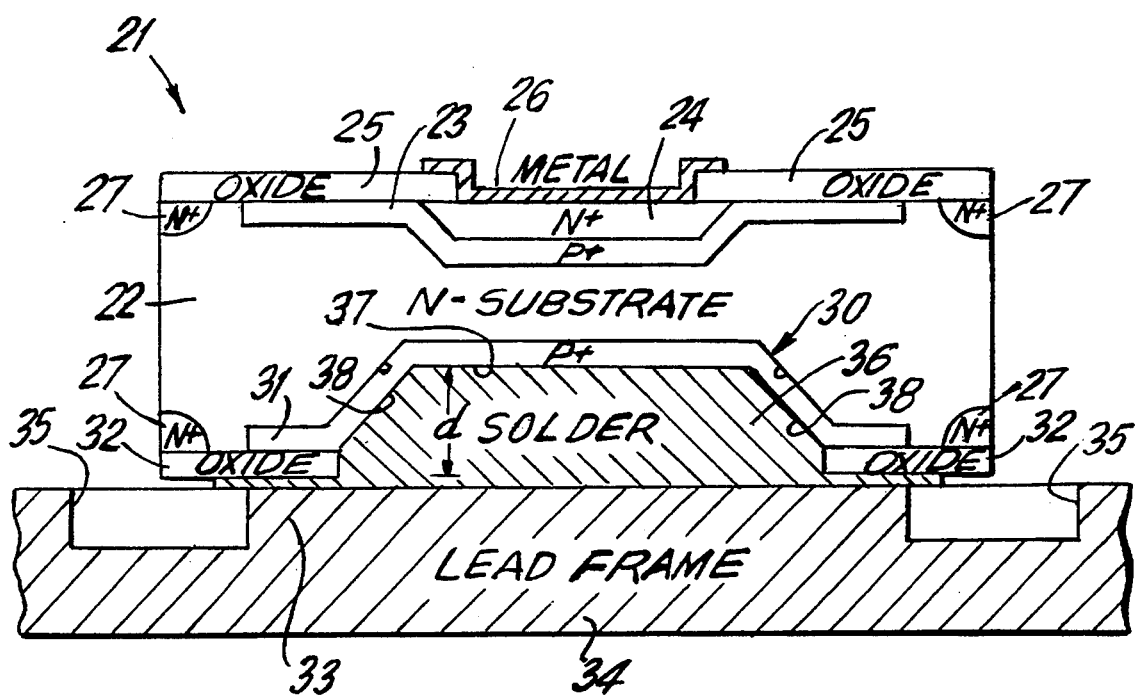
FIG. 1 is a cross-sectional view of a semiconductor device made in accordance with the present invention.

Although the preferred embodiment will be described in the context of an optically-triggered silicon controlled rectifier (SCR) structure and fabrication technique, it will be evident to those skilled in these arts that our invention has broad application with respect to a wide variety of other layered semiconductor devices, such as field effect transistors (FETs) and the like.

In general, an SCR is a four-layer P-N-P-N unidirectional device which is primarily used for bistable switching. A typical SCR has three semiconductor junctions, formed from layers of semiconductor material, and three terminals: anode, cathode and gate, each of which conductively connects to a corresponding layer of the device. Gate current is one factor that determines an anode-to-cathode voltage, i.e., the so-called "breakover" voltage, at which the device begins to conduct current from the cathode to the anode. In an optically-triggered SCR, the control element or gate is an optically sensitive layer located between the anode and cathode. Illuminating optical radiation produces a photo-current in the optically sensitive layer. The amount of photo-current determines the anode-to-cathode voltage at which the device begins to conduct. The anode-to-cathode voltage during conduction is known as the forward voltage. During full conduction, the forward voltage of the SCR is a function of the spacing between the anode and cathode.

FIG. 1 shows a portion of optically-triggered, vertical SCR 21 mounted on lead frame 34. Specifically, SCR 21 is formed on N type substrate 22 by diffusing P type impurities into an upper region of the substrate to form P+ control layer 23. The control layer is comparatively thicker in a central portion than towards the edges of the layer. N+ cathode layer 24 is formed by diffusing N type impurities into the central portion of control layer 23. Oxide layer 25 is formed on the outer portion of layer 23 and partly covers the edge of layer 24 leaving an opening in which a metal layer is deposited to form cathode terminal 26. Oxide layer 25 is permeable to optical radiation such that P+ control layer 23 can be illuminated with an incident light beam. The light beam is a conventional optical control beam, which, if of sufficient intensity, triggers SCR 21.

Vertical trench 30 is etched into the bottom surface of substrate 22. The trench has bottom 37 and sides 38 which form a surface and define a depth (symbolized by distance "d"). P type impurities are diffused into substrate 22 in the surface of trench 30 to form P+ anode layer 31. By accurately controlling the depth of the trench, the spacing between layers 31 and 23 is accurately controlled. Oxide layer 32 is formed on the bottom surface of substrate 22 and along a circumferential edge of P+ layer 31. Four N+ regions form conventional channel stops 27 which prevent surface leakage during reverse bias of the SCR.

SCR 21 is mounted on raised pedestal 33 formed in lead frame 34. The lead frame provides structural support for the semiconductor device and a contact area for connection of a conductive lead (not shown). Pedestal 33, which may be created by etching, stamping or otherwise forming depression 35 in the upper surface of frame 34, electrically isolates lead frame 34 from the circumferential edges of the silicon substrate which forms the SCR.

SCR 21 is preferably mounted on frame 34 by a soldering process. This process produces an ohmic contact between an exposed portion of P+ layer 31 and frame 34. This contact provides anode terminal 36.

In a typical SCR application, an applied voltage is connected between cathode terminal 26 and anode terminal 36. When optical radiation of a sufficient intensity passes through layer 25 to illuminate P+ control layer 23, a photo-current is generated in layer 23. The amount of photo-current produced will primarily determine the breakover voltage of SCR 21, i.e., the value of the applied voltage at which SCR 21 begins to conduct. When the SCR is triggered by an external light pulse and the applied voltage forms a forward bias that is greater than the breakover voltage, the SCR conducts current vertically between cathode terminal 26 and anode terminal 36. SCR 21 will continue to conduct until the applied voltage forming the forward bias is removed or falls below a level known as a forward voltage. The value of the forward voltage at full conduction is a function of the vertical spacing between layers 24 and 31. As such, the operating characteristics of SCR 21, i.e., its forward voltage at normal anode current, is dependent on the ability to obtain an appropriate layer spacing during fabrication. In accordance with the teachings of our present invention, this vertical spacing is readily controllable via the etching of vertical trench 30 within which the anode layer is formed.

As is well known in the art, the depth of a trench is more accurately controllable than the diffusion depth of a layer produced using a deep diffusion technique. As such and in accordance with our present invention, the trench is accurately etched to a particular depth into the substrate and a P+ anode layer is diffused into the surface of the trench. Because the depth of the P+ anode layer is primarily controlled by the depth of the trench which, in turn, primarily controls the spacing between the control layer and the anode layer, neither the control layer nor the anode layer need be deeply diffused. Thus, the spacing between the anode and control layers can be accurately controlled, i.e., less diffusion depth permits accurate depth control. Additionally, using a trench to define the spacing between layers permits the device to be constructed upon a relatively thick substrate. Since maximum wafer diameter is a function of wafer thickness, the capability of using a relatively thick substrate for the device permits use of a relatively large wafer upon which many devices can be formed. Given the foregoing description of our invention, those skilled in the art would readily be able to determine appropriate dimensions of the trench and the various layers to produce an operational semiconductor device having desired operating characteristics.

Obviously many modifications and variations of the present invention are possible in the light of the above teachings. As mentioned above, the use of an etched trench to achieve the correct spacing between semiconductor layers is applicable to a variety of layered discrete and integrated circuit devices such as SCRs, FETs and the like.

What is claimed is:

1. A method of fabricating a semiconductor device comprising:

providing a semiconductor substrate having first and second opposed surfaces;

forming a first layer of doped impurities in said first surface of said semiconductor substrate;

etching a trench in said second surface of said semiconductor substrate, wherein said trench has a depth and a surface, the surface of the trench being formed immediately opposite the first layer of doped impurities; and forming a second layer of doped impurities in the surface of said trench such that the depth of said trench substantially defines spacing between said first and second layers.

2. The method of claim 1 wherein said forming steps include oppositely doping said first and second layers with respect to said semiconductor substrate.

3. The method of claim 2 further including forming a third layer of doped impurities in said first layer so that the first layer lies between the third layer and the semiconductor substrate, and wherein said first and third layers are oppositely doped.

4. The method of claim 3 further including depositing ohmic contacts on said second and third layers, and mounting said ohmic contact deposited on said second layer on a lead frame.

5. A method of fabricating an optically-triggered silicon controlled rectifier (SCR) device comprising:

providing an N type substrate having an upper surface and a lower surface;

diffusing a first P+ layer into the upper surface of said substrate;

diffusing an N+ layer into an upper surface of said first P+ layer;

forming a permeable oxide layer on a portion of said first P+ layer;

depositing a cathode contact on said N+ layer;

etching a trench into the lower surface of said substrate wherein said trench has a depth and a surface;

diffusing a second P+ layer into the surface of said trench such that the depth of said trench substantially defines a spacing between said first and second P+ layers; and depositing an anode contact on said trench in contact with said second P+ layer.

6. The method of claim 5 further including mounting said anode contact on a lead frame.

7. A method of fabricating a semiconductor device, comprising:
(a) providing a semiconductor substrate having first and second opposed surfaces, the second surface being configured with a recessed area;
(b) forming a cathode layer in the first surface of said semiconductor substrate immediately opposite the recessed area of the second surface of said semiconductor substrate;
(c) fixing a cathode contact to said cathode layer;
(d) forming an anode layer in the surface of said recessed area; and
(e) placing an anode contact in said recessed area in contact with said anode layer, the depth of said recessed area being selected to obtain an operating characteristic of the device by defining a spacing between the anode layer and the cathode layer.

8. The method of claim 7, further comprising forming a control layer in the first surface of said semiconductor substrate so that the cathode layer is located in a first surface of the control layer.

9. The method of claim 8, wherein the device is a silicon controlled rectifier.

10. The method of claim 9, wherein the operating characteristic is a level of forward voltage.

* * * * *